(12) United States Patent
Hiratani et al.

(10) Patent No.: US 11,711,887 B2
(45) Date of Patent: Jul. 25, 2023

(54) SUBSTRATE STRUCTURE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shungo Hiratani, Yokkaichi (JP); Shinsuke Okumi, Yokkaichi (JP); Arinobu Nakamura, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/619,054

(22) PCT Filed: May 28, 2020

(86) PCT No.: PCT/JP2020/021110
§ 371 (c)(1),
(2) Date: Dec. 14, 2021

(87) PCT Pub. No.: WO2020/255666
PCT Pub. Date: Dec. 24, 2020

(65) Prior Publication Data
US 2022/0361317 A1 Nov. 10, 2022

(30) Foreign Application Priority Data
Jun. 17, 2019 (JP) ................................. 2019-112115

(51) Int. Cl.
*H05K 1/02* (2006.01)

(52) U.S. Cl.
CPC ......... *H05K 1/0207* (2013.01); *H05K 1/0209* (2013.01); *H05K 2201/10166* (2013.01); (Continued)

(58) Field of Classification Search
CPC ......... H05K 1/181; H05K 2201/09345; H05K 1/0293; H05K 2201/0929; H05K 2201/093; H05K 1/0207; H05K 1/0209
See application file for complete search history.

(56) References Cited

U.S. PATENT DOCUMENTS

| 7,167,377 B2 | 1/2007 | Onizuka et al. |
| 10,958,055 B2 | 3/2021 | Uchida et al. |
| 2015/0084051 A1* | 3/2015 | Kubo ..................... H05K 1/181 |
| | | 438/15 |

FOREIGN PATENT DOCUMENTS

| JP | H1-127282 U | 8/1989 |
| JP | 2000-151056 A | 5/2000 |

(Continued)

OTHER PUBLICATIONS

International Search Report, Application No. PCT/JP2020/021110, dated Aug. 18, 2020. ISA/Japan Patent Office.

*Primary Examiner* — Jeremy C Norris
(74) *Attorney, Agent, or Firm* — Honigman LLP

(57) ABSTRACT

An object of the present disclosure is to be able to further reduce the size of a substrate structure including a plurality of elements. The substrate structure includes: a base substrate that includes a first conductive plate and a second conductive plate; a first element connected to the first conductive plate and the second conductive plate; and a second element connected to the first conductive plate and the second conductive plate. The first conductive plate and the second conductive plate are disposed on the same plane on the base substrate in a state of being electrically insulated from each other, the first element is mounted on a first main (Continued)

surface of the base substrate, and the second element is mounted on a second main surface that is on the opposite side to the first main surface relative to the base substrate.

8 Claims, 4 Drawing Sheets

(52) U.S. Cl.
CPC .............. *H05K 2201/10272* (2013.01); *H05K 2201/10522* (2013.01); *H05K 2201/10545* (2013.01); *H05K 2201/10553* (2013.01); *H05K 2201/10681* (2013.01); *H05K 2201/10977* (2013.01); *H05K 2201/10984* (2013.01)

(56) References Cited

FOREIGN PATENT DOCUMENTS

| | | |
|---|---|---|
| JP | 2016-220277 A | 12/2016 |
| JP | 2017-208508 A | 11/2017 |

\* cited by examiner

US 11,711,887 B2

SUBSTRATE STRUCTURE

CROSS-REFERENCE TO RELATED APPLICATIONS

This application is the U.S. national stage of PCT/JP2020/021110 filed on May 28, 2020, which claims priority of Japanese Patent Application No. JP 2019-112115 filed on Jun. 17, 2019, the contents of which are incorporated herein.

TECHNICAL FIELD

The present disclosure is related to a substrate structure.

BACKGROUND

JP 2003-164039A discloses a circuit structure that includes a plurality of bus bars, semiconductor switching elements, and a control circuit substrate. The bus bars are adhered to a surface of the control circuit substrate in a state of being arranged side by side with each other on approximately the same plane. The semiconductor switching elements are mounted on both the bus bars and the control circuit substrate.

JP 2016-220277A discloses an electrical junction box that includes a pair of bus bars and an interruption portion that is mounted on the pair of bus bars and allows/interrupts the passage of a current between the pair of bus bars.

In JP 2003-164039A and JP 2016-220277A, a plurality of semiconductor switching elements are mounted on one main surface side of the bus bars that are arranged side by side with each other on the same plane. Here, a further reduction in the size of a substrate structure including bus bars and a plurality of elements connected to the bus bars is desired.

Thus, it is an object of the present disclosure to further reduce the size of a substrate structure including a plurality of elements.

SUMMARY

A substrate structure according to the present disclosure including: a base substrate including a first conductive plate and a second conductive plate; a first element connected to the first conductive plate and the second conductive plate; and a second element connected to the first conductive plate and the second conductive plate, wherein the first conductive plate and the second conductive plate are disposed on the base substrate on the same plane in a state of being electrically insulated from each other, the first element is mounted on a first main surface of the base substrate, and the second element is mounted on a second main surface that is on the opposite side to the first main surface relative to the base substrate.

Advantageous Effects of Invention

With the present disclosure, the size of a substrate structure that includes a plurality of elements can be further reduced.

DETAILED DESCRIPTION OF PREFERRED EMBODIMENTS

Figure 1:
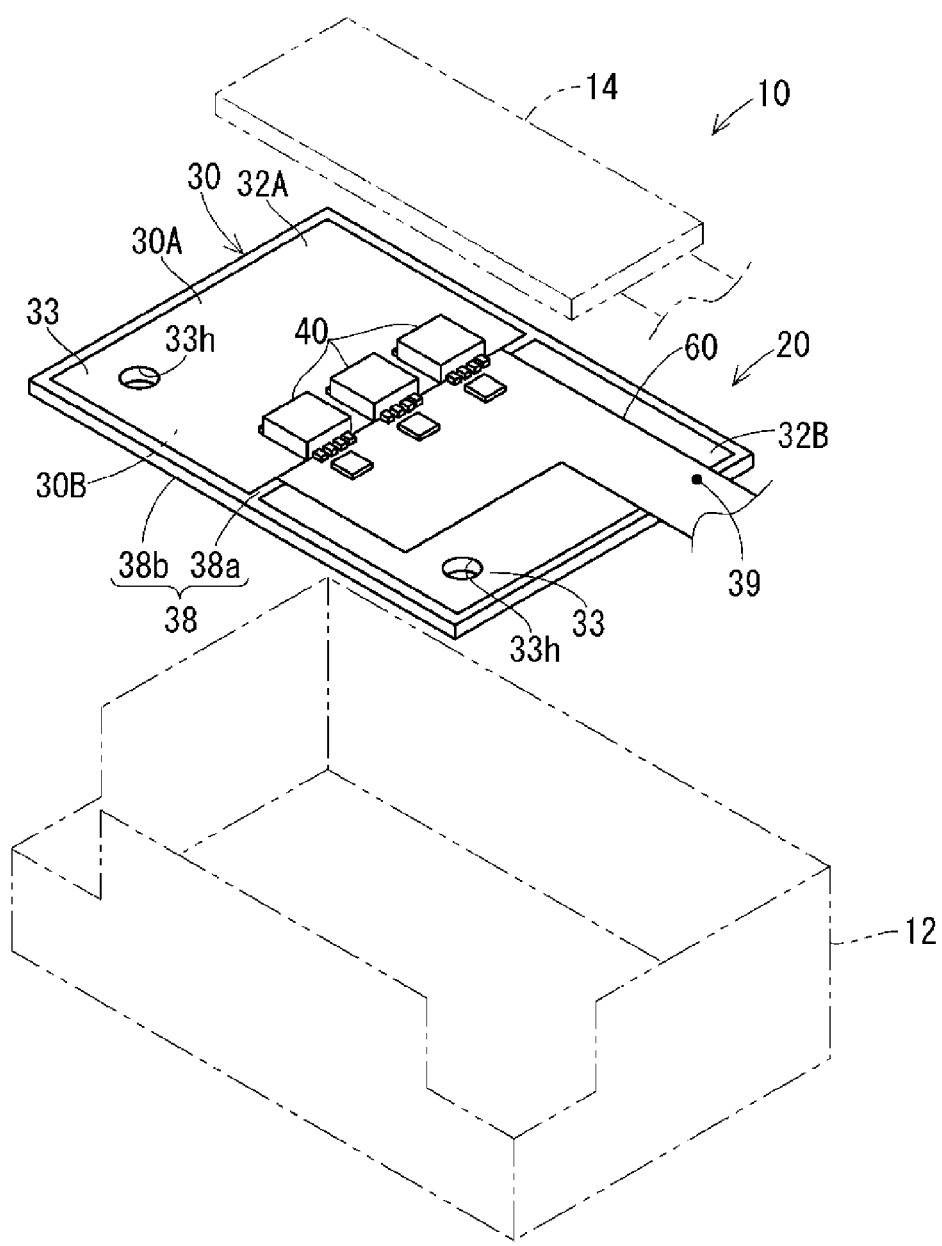
FIG. 1 is a schematic exploded perspective view showing an electrical junction box according to Embodiment 1.

First, embodiments of the present disclosure will be listed and described.

The substrate structure of the present disclosure is as follows.

A substrate structure including: a base substrate including a first conductive plate and a second conductive plate; a first element connected to the first conductive plate and the second conductive plate; and a second element connected to the first conductive plate and the second conductive plate, wherein the first conductive plate and the second conductive plate are disposed on the base substrate on the same plane in a state of being electrically insulated from each other, the first element is mounted on a first main surface of the base substrate, and the second element is mounted on a second main surface that is on the opposite side to the first main surface relative to the base substrate. The first element and the second element can be disposed in the smallest possible region without interfering with each other. Thus, the size of the substrate structure including a plurality of elements can be further reduced.

The base substrate may include an insulating portion that is molded in a mold with the first conductive plate and the second conductive plate acting as inserts, and the insulating portion may insulate the first conductive plate and the second conductive plate from each other, and hold the first conductive plate and the second conductive plate in a state of extending along the same plane. The first conductive plate and the second conductive plate are held on the same plane in a state where the first conductive plate and the second conductive plate are electrically insulated from each other by the insulating portion.

The first element and the second element may be mounted so as to at least partially overlap each other in a direction extending along a boundary between the first conductive plate and the second conductive plate. The first element and the second element can be disposed in the smallest region possible.

The first element and the second element may be mounted dispersed on two sides of a boundary between the first conductive plate and the second conductive plate. Heat generated by the first element and the second element is dispersed. Accordingly, the heat dissipation effect is increased.

The substrate structure may further include: a first sheet-shaped wiring member overlaid on the first main surface of the base substrate; and a second-sheet shaped wiring member overlaid on the second main surface of the base substrate, wherein the first element is a first switching element that includes a first control terminal that receives a control signal, and allows and interrupts the passage of a current between the first conductive plate and the second conductive plate in response to the control signal received by the first control terminal, the second element is a second switching element that includes a second control terminal that receives a control signal, and allows and interrupts the passage of a current between the first conductive plate and the second conductive plate in response to the control signal received by the second control terminal, the first sheet-shaped wiring member includes a first linear conductor connected to the first control terminal, and the second sheet-shaped wiring member includes a second linear conductor connected to the second control terminal. On both surfaces of the base substrate, the first control terminal and the second control terminal can be connected to an external device using the first sheet-shaped wiring member or the second sheet-shaped wiring member.

The first linear conductor and the second linear conductor may be electrically connected to each other at a portion of the base substrate excluding the first conductive plate and the second conductive plate, via a conductive portion. The first control terminal and the second control terminal can easily be connected to an external control substrate.

Specific examples of a substrate structure of the present disclosure will be described below with reference to the drawings. Note that the present disclosure is not limited to these illustrations, but is indicated by the claims, and all changes that come within the meaning and range of equivalency of the claims are intended to be embraced therein.

Embodiment 1

A substrate structure according to Embodiment 1 is described below. In Embodiment 1, an electrical junction box 10 including a substrate structure 20 is described as an example.

Figure 2:
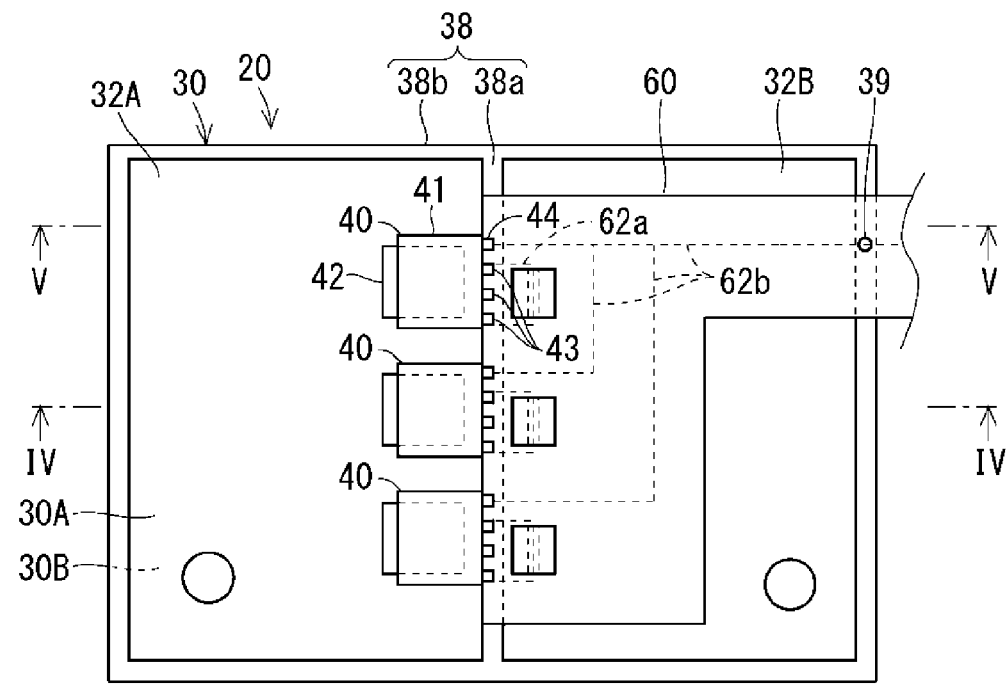
FIG. 2 is a plan view showing a substrate structure.
Figure 3:
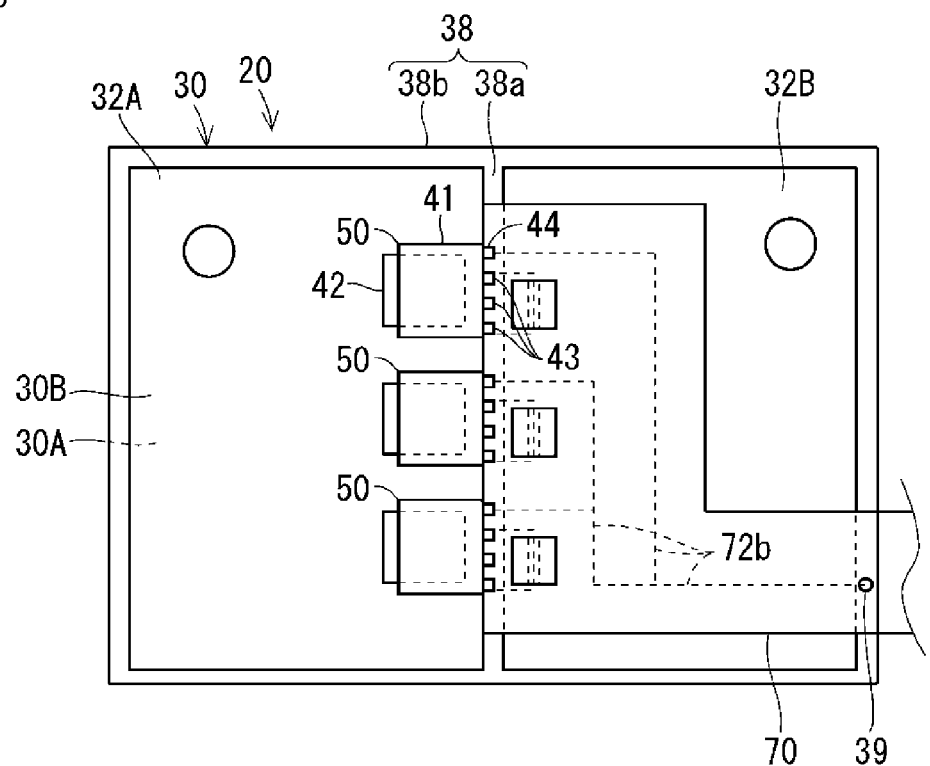
FIG. 3 is a bottom view showing a substrate structure.
Figure 4:
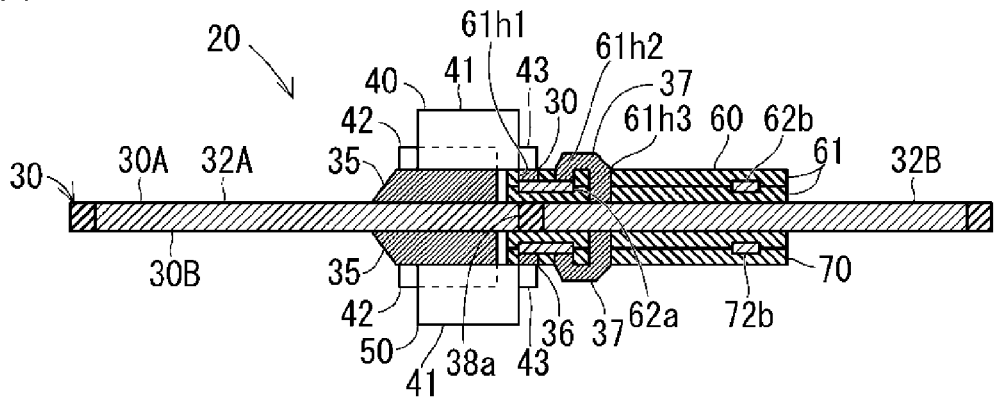
FIG. 4 is a cross-sectional view taken along line IV-IV in FIG. 2.
Figure 5:
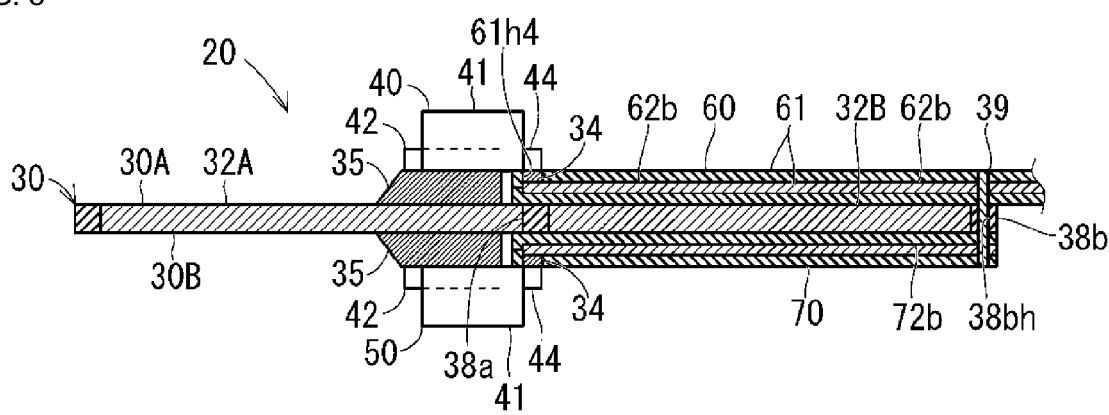
FIG. 5 is a cross-sectional view taken along line V-V in FIG. 2.

FIG. 1 is a schematic exploded perspective view showing the electrical junction box 10 according to Embodiment 1. FIG. 2 is a plan view showing the substrate structure 20. FIG. 3 is a bottom view showing the substrate structure 20. FIG. 4 is a cross-sectional view taken along line IV-IV in FIG. 2. FIG. 5 is a cross-sectional view taken along line V-V in FIG. 2. Note that, for ease of description, dimensions such as the thickness of portions in FIGS. 4 and 5 may be illustrated in an exaggerated manner.

Overall Configuration of Electrical Junction Box

The electrical junction box 10 includes the substrate structure 20, a casing 12, and a control substrate 14.

The casing 12 is made of resin or the like. The substrate structure 20 and the control substrate 14 are housed in the casing 12. The casing 12 is provided with a recess for exposing an external connection portion 33 of the substrate structure 20 to the outside.

The substrate structure 20 includes a base substrate 30, a first element 40, and a second element 50. The base substrate 30 includes a first conductive plate 32A and a second conductive plate 32B. The first element 40 is connected to the first conductive plate 32A and the second conductive plate 32B. The second element 50 is connected to the first conductive plate 32A and the second conductive plate 32B. In this substrate structure 20, a current flows through the first conductive plate 32A, the first element 40, the second element 50, and the second conductive plate 32B. A current may either flow from the first conductive plate 32A to the second conductive plate 32B or from the second conductive plate 32B to the first conductive plate 32A.

The control substrate 14 is connected to the substrate structure 20. The control substrate 14 controls operations of the substrate structure 20. For example, the control substrate 14 turns a current flowing through the substrate structure 20 on and off.

This electrical junction box 10 is provided, for example, on a power supply path between a power source and various electrical components in an automobile.

Substrate Structure

The substrate structure 20 includes the base substrate 30, the first element 40, and the second element 50.

The base structure 30 includes the first conductive plate 32A and the second conductive plate 32B. The first conductive plate 32A and the second conductive plate 32B are members constituted by metal plates or the like. The first conductive plate 32A and the second conductive plate 32B may also be referred to as bus bars. Here, as an example, the first conductive plate 32A and the second conductive plate 32B are each formed in a rectangular plate shape. The first conductive plate 32A and the second conductive plate 32B function as an external path for currents that flow through the first element 40 and the second element 50.

In the base substrate 30, the first conductive plate 32A and the second conductive plate 32B are disposed on the same plane while being electrically insulated from each other. Here, a portion of the outer periphery of the first conductive plate 32A is provided with a straight edge portion. Also, a portion of the outer periphery of the second conductive plate 32B is provided with a straight edge portion. The straight edge portion of the first conductive plate 32A and the straight edge portion of the second conductive plate 32B are arranged parallel to each other and facing each other with an interval therebetween. Thus, the first conductive plate 32A and the second conductive plate 32B are electrically insulated from each other.

Here, the base substrate 30 further includes an insulating portion 38. The insulating portion 38 is a portion that is made of resin or the like. The insulating portion 38 is a portion molded in a mold with the first conductive plate 32A and the second conductive plate 32B acting as inserts.

More specifically, the insulating portion 38 includes an insulating interposed portion 38a and an insulating holding portion 38b. The insulating interposed portion 38a is provided between the straight edge portion of the first conductive plate 32A and the straight edge portion of the second conductive plate 32B. The insulating interposed portion 38a keeps the first conductive plate 32A and the second conductive plate 32B electrically insulated from each other as reliably as possible. The insulating holding portion 38b is provided so as to surround the outer peripheries of the first conductive plate 32A and the second conductive plate 32B. As a result of the first conductive plate 32A and the second conductive plate 32B being surrounded by the insulating interposed portion 38a and the insulating holding portion 38b, the first conductive plate 32A and the second conductive plate 32B are held on the same plane.

Another configuration may be used to keep the first conductive plate 32A and the second conductive plate 32B disposed on the same plane in a state of being electrically insulated from each other. For example, a configuration may be employed where the first conductive plate 32A and the second conductive plate 32B are fit into a resin frame member that has been molded in advance using a mold. A configuration may be employed where the first conductive plate 32A and the second conductive plate 32B are joined to a sheet-shaped member or the like. In this case, a portion of the sheet-shaped member where an element is to be mounted may be provided with a hole.

The first conductive plate 32A and the second conductive plate 32B are each provided with a hole 33h. The portions of the first conductive plate 32A and the second conductive plate 32B where the holes 33h are formed can function as external connection portions 33 for connecting the first conductive plate 32A and the second conductive plate 32B to an external conductive path.

The first element 40 is an element that is connected to the first conductive plate 32A and the second conductive plate 32B. The first element 40 is an element that corresponds to the application of the electrical junction box 10. For example, a semiconductor switching element illustrated by a field effect transistor (also referred to as an "FET" below) is employed as the first element 40. The first element 40 may be a resistor, a coil, or a capacitor.

Here, a case is illustrated where the first element 40 is an FET. More specifically, the first element 40 is a surface-mounted power MOSFET, for example. The first element 40 includes an element main body portion 41, a first terminal 42, a second terminal 43, and a third terminal 44. Either the first terminal 42 or the second terminal 43 functions as a source electrode, and the other functions as a drain electrode. Below, an example is illustrated where the first electrode 42 is a drain electrode and the second terminal 43 is a source electrode.

When a case is envisioned where the first element 40 is a first switching element such as a semiconductor switching element, the third terminal 44 is a first control terminal that receives a control signal, for example. The first element 40 allows and interrupts the passage of a current between the first conductive plate 32A and the second conductive plate 32B, in response to a control signal received by the third terminal 44. If a case is envisioned where the first element 40 is an FET, the third electrode 44 is a gate electrode.

The element main body portion 41 is formed in a flat rectangular parallelepiped shape, for example. Here, the first terminal 42 is provided protruding from the bottom portion of the element main body portion 41 to one side portion thereof. The second terminal 43 and the third terminal 44 are provided protruding from the other side portion of the element main body portion 41. Here, a plurality of second terminals 43 are provided.

The first element 40 is connected to the first conductive plate 32A and the second conductive plate 32B. Also, the first element 40 is mounted on a first main surface 30A of the base substrate 30. In this embodiment, the element main body portion 41 of the first element 40 is positioned on the first conductive plate 32A. The first terminal 42 on the first conductive plate 32A is electrically connected to the first conductive plate 32A. Here, the first terminal 42 is connected to the first conductive plate 32A via solder 35 (see FIG. 4). A connection portion realized by solder between two portions may be fixed in a state where the two portions are electrically connected to each other. For example, the two portions may be connected using a conductive adhesive.

The second terminals 43 are connected to the second conductive plate 32B. Here, the second terminals 43 extend from the element main body portion 41 on the first conductive plate 32A toward the second conductive plate 32B. The second terminals 43 are positioned above the insulating interposed portion 38a.

The second terminals 43 are electrically connected to the second conductive plate 32B via a first sheet-shaped wiring member 60. The first sheet-shaped wiring member 60 is a member formed in the shape of a sheet in which a conductor is covered with an insulating member. Here, a case where the first sheet-shaped wiring member 60 is a flexible printed circuit (FPC) is illustrated. That is, the first sheet-shaped wiring member 60 is a sheet-shaped member in which a conductor made of a metal foil (copper foil) or the like is sandwiched between a pair of resin films 61.

The first sheet-shaped wiring member 60 is provided on the first main surface of the base substrate 30, in the shape of a sheet that extends from the insulating interposed portion 38a toward the second conductive plate 32B.

The first sheet-shaped wiring member 60 includes a relay conductor 62a and a first linear conductor 62b serving as conductors. The relay conductor 62a is formed extending from a region below the second terminals 43 of the first element 40 toward the second conductive plate 32B. Here, the relay conductor 62a is formed in the shape of a square spanning from a region where it expands below all of the corresponding second terminals 43 toward the second conductive plate 32B.

Of the pair of resin films 61, the resin film 61 on the second terminals 43 side is provided with an opening 61h1 that is open to the region immediately below the second terminals 43. Also, the same resin film 61 on the second terminals 43 side is provided with an opening 61h2 that is open to a region that is closer to the second conductive plate 32B than the opening 61h1 is. The relay conductor 62a can be exposed from the openings 61h1 and 61h2.

Furthermore, the first sheet-shaped wiring member 60 is provided with a through hole 61h3 that extends through the first sheet-shaped wiring member 60 in a region away from the opening 61h2. The second conductive plate 32B can be exposed from the through hole 61h3.

In a state where the first sheet-shaped wiring member 60 is overlaid on the first main surface 30A of the base substrate 30, the second terminals 43 are connected to the relay conductor 62a exposed from the opening 61h1 via solder 36 (see FIG. 4). Also, the relay conductor 62a exposed from the opening 61h2 and the second conductive plate 32B exposed from the through hole 61h3 are connected to each other via solder 37 (see FIG. 4). Thus, the second terminals 43 are electrically connected to the second conductive plate 32B via the solder 36, the relay conductor 62a, and the solder 37. Therefore, the first element 40 is mounted on the first main surface 30A of the base substrate 30 in a state of being electrically connected to the first conductive plate 32A and the second conductive plate 32B. Note that the second terminals 43 may be directly connected to the second conductive plate 32B via solder or the like.

The third terminal 44 is connected to the first linear conductor 62b. The first linear conductor 62b is a linear conductor that extends from the region below the third terminal 44 to any position of the outer periphery of the base substrate 30. Of the pair of resin films 61, the resin film 61 on the third terminal 44 side is provided with an opening 61h4 that is open to the region immediately below the third terminal 44. The third terminal 44 is connected to the first linear conductor 62b exposed from the opening 61h4 via solder 34 (see FIG. 5).

The first sheet-shaped wiring member 60 may extend to the outside of the base substrate 30 and be connected to the control substrate 14. In this case, the first linear conductor 62b may extend toward the outside of the first sheet-shaped wiring member 60 and be connected to the control substrate 14. Accordingly, a control signal output from the control substrate 14 is provided to the third terminal 44 via the first linear conductor 62b.

The second element 50 has a similar structure to that of the first element 40. The same reference numbers are given to configurations of the second element 50 that are the same as those of the first element 40, and redundant description is omitted.

The second element 50 is connected to the first conductive plate 32A and the second conductive plate 32B. Also, the second element 50 is mounted on a second main surface 30B of the base substrate 30. The configuration for mounting the second element 50 on the base substrate 30 is the same as the configuration for mounting the first element 40 on the base substrate 30, excluding the following configurations. The configurations differ in that the second element 50 is mounted on the second main surface 30B of the base substrate 30 on the opposite side to the first main surface 30A, and that a second sheet-shaped wiring member 70 is used instead of the first sheet-shaped wiring member 60. Here, the opposite side to the first main surface 30A relative to the base substrate 30 means the opposite side in the thickness direction of the base substrate 30. It should be noted that, for configurations for mounting the second element 50 on the base substrate 30, the configuration portions that are the same as those for mounting the first element 40 on the base substrate 30 are given the same reference numerals and redundant description thereof is omitted.

The position where the second element 50 is mounted is in a region on the opposite side to the region where the first element 40 is mounted, in the thickness direction of the base substrate 30. Thus, when the substrate structure 20 is viewed in a plan view along the thickness direction thereof, the first element 40 and the second element 50 are disposed in regions overlapping each other.

The first element 40 and the second element 50 do not necessarily need to be disposed in the same region when the substrate structure 20 is viewed in a plan view. The first element 40 and the second element 50 may be mounted at positions shifted from each other in a direction extending along the boundary (here, the insulating interposed portion 38a) between the first conductive plate 32A and the second conductive plate 32B. In this case, it is preferable that the first element 40 and the second element 50 partially overlap each other in a direction extending along the boundary (here, the insulating interposed portion 38a) between the first conductive plate 32A and the second conductive plate 32B. Also, one of the first element 40 and the second element 50 may be mounted on the first conductive plate 32A side and the other of the two may be mounted on the second conductive plate 32B side. In this case as well, it is preferable that the first element 40 and the second element 50 are mounted so as to at least partially overlap each other in the direction extending along the boundary between the first conductive plate 32A and the second conductive plate 32B. Embodiment 2 will be described based on the latter example.

The second sheet-shaped wiring member 70 differs from the first sheet-shaped wiring member 60 in the following points. The second sheet-shaped wiring member 70 is overlaid onto the second main surface 30B on the opposite side to the first main surface 30A relative to the base substrate 30. The portion of the first sheet-shaped wiring member 60 that extends outward from the base substrate 30 and is connected to the control substrate 14 is omitted from the second sheet-shaped wiring member 70. A second linear conductor 72b that corresponds to the first linear conductor 62b is connected to the third terminal 44 of the second element 50. The second linear conductor 72b extends from the portion where it is connected to the third terminal 44 to the insulating holding portion 38b. Note that the third terminal of the second element 50 is an example of a second control terminal.

It should be noted that, for other configurations of the second sheet-shaped wiring member 70 that are the same as those of the first sheet-shaped wiring member 60, the same reference numerals are given and redundant description is omitted.

The first linear conductor 62b and the second linear conductor 72b are electrically connected to each other at a portion of the base substrate 30 excluding the first conductive plate 32A and the second conductive plate 32B, via a conductive portion 39. Here, when the base substrate 30 is viewed in a plan view, the first linear conductor 62b and the second linear conductor 72b extend along the same path. The portion of the first linear conductor 62b that passes through the insulating holding portion 38b and the portion of the second linear conductor 72b that reaches the insulating holding portion 38b are connected to each other via the conductive portion 39. The conductive portion 39 is a conductive member that extends through the insulating holding portion 38b and connects the first linear conductor 62b and the second linear conductor 72b to each other. For example, a through hole 38bh is formed in the insulating holding portion 38b. Also, a through hole is formed in the portion corresponding to the through hole 38bh between the first linear conductor 62b and the second linear conductor 72b, and is formed in a state where the first linear conductor 62b and the second linear conductor 72b are exposed at the circumferential edge portion thereof. Solder is provided so as to extend through the through hole 38bh along the inner circumferential surface thereof or so as to fill the entire internal portion of the through hole 38bh, and the solder is soldered to the exposed portions of the first linear conductor 62b and the second linear conductor 72b. The conductive portion 39 formed in this manner extends through the through hole 38bh and electrically connects the first linear conductor 62b and the second linear conductor 72b to each other.

Also, in Embodiment 1, a case in which a plurality of the first elements 40 and a plurality of the second elements 50 are provided was illustrated as an example.

On the first main surface 30A of the base substrate 30, the plurality of first elements 40 are mounted parallel to each other along the boundary between the first conductive plate 32A and the second conductive plate 32B. The first linear conductor 62b extends branched toward each third terminal 44 of the first elements 40.

On the second main surface 30B of the base substrate 30, the plurality of second elements 50 are mounted parallel to each other along the boundary between the first conductive plate 32A and the second conductive plate 32B. The second linear conductor 72b extends branched toward each third terminal 44 of the second elements 50.

The first elements 40 and the second elements 50 are all mounted on the base substrate 30, located on the first conductive plate 32A side. Also, the spacing between the first elements 40 is the same as the spacing between the second elements 50. When the base substrate 30 is viewed in a plan view, a positional relationship is realized where the first elements 40 and the second elements 50 overlap each other in the same region.

Note that the number of the first elements 40 and the second elements 50 may be set as appropriate.

Effects and the Like of Embodiment 1

With the substrate structure 20 configured as described above, the first elements 40 are mounted on the first main surface 30A of the base substrate 30, and the second elements 50 are mounted on the second main surface 30B of the base substrate 30. Thus, the first elements 40 and the second elements 50 can be mounted in the smallest possible region without interfering with each other. Therefore, the substrate structure 20 provided with the elements 40 and 50 can be made even smaller.

Also, the elements that connect the first conductive plate and the second conductive plate to each other are mounted along the boundary between the first conductive plate and the second conductive plate. When it is envisioned that a plurality of elements are mounted on only one main surface of the base substrate, the elements are arranged parallel to each other along the boundary, and thus the region in which the elements are mounted is increased. Thus, it is preferable that the first elements 40 and the second elements 50 are mounted so as to overlap each other in the direction extending along the boundary between the first conductive plate 32A and the second conductive plate 32B. Accordingly, the region in which the elements 40 and 50 are mounted in the direction extending along the boundary between the first conductive plate 32A and the second conductive plate 32B is reduced in size.

Note that, on the premise that more than one second element 50 is provided, there is no need for the first elements 40 to overlap all of the second elements 50 in a direction extending along the boundary. The first elements 40 may overlap some of the second elements 50 in a direction extending along the boundary. Similarly, on the premise that more than one first element 40 is provided, there is no need for the second elements 50 to overlap all of the first elements 40 in a direction extending along the boundary. The second elements 50 may overlap some of the first elements 40 in a direction extending along the boundary. Also, another element may be mounted on the first main surface 30A or the second main surface 30B of the base substrate 30 without overlapping an element on the opposite side of the first main surface 30A or the second main surface 30B in the direction extending along the boundary.

Also, the first sheet-shaped wiring member 60 is overlaid on the first main surface 30A of the base substrate 30. The first linear conductor 62b of the first sheet-shaped wiring member 60 is connected to the third terminals 44, which are the first control terminals of the first elements 40. The second sheet-shaped wiring member 70 is overlaid onto the second main surface 30B of the base substrate 30. The second linear conductor 72b of the second sheet-shaped wiring member 70 is connected to the third terminals 44, which are the second control terminals of the second elements 50. Thus, the elements 40 and 50 mounted to both surfaces of the base substrate 30 are connected to the external control substrate 14 or the like via the first sheet-shaped wiring member 60 and the second sheet-shaped wiring member 70.

Furthermore, the first sheet-shaped wiring member 60 and the second sheet-shaped wiring member 70 are electrically connected to each other via the conductive portion 39. Thus, for example, a configuration can be employed where the first sheet-shaped wiring member 60 is drawn to the outside of the base substrate 30 and connected to the control substrate 14. Accordingly, with a comparatively simple configuration, the third terminals 44 that are the first control terminals of the first elements 40, and the third terminals 44 that are the second control terminals of the second elements 50 can be connected to the external control substrate 14 or the like.

Embodiment 2

Figure 6:
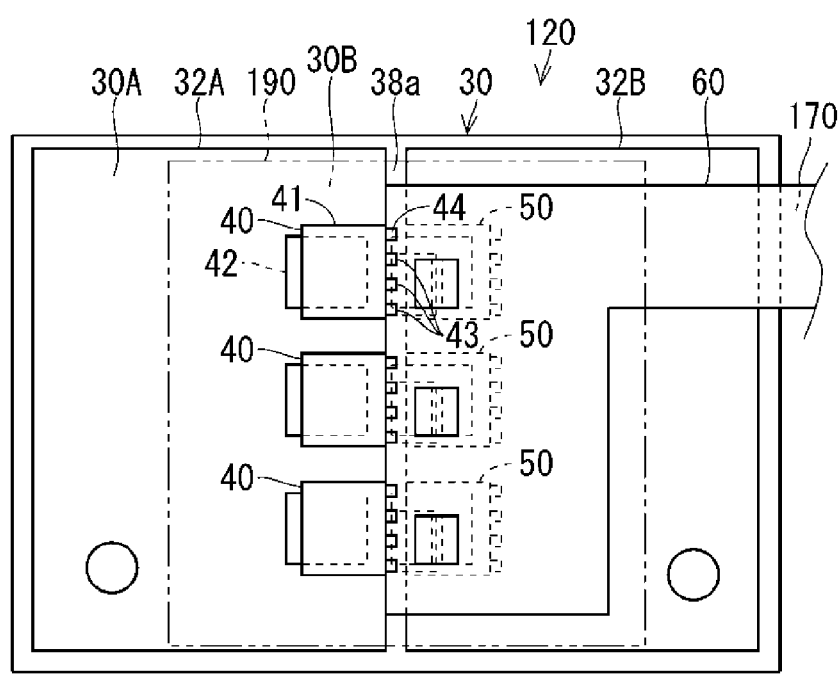
FIG. 6 is a plan view showing a substrate structure according to Embodiment 2.
Figure 7:
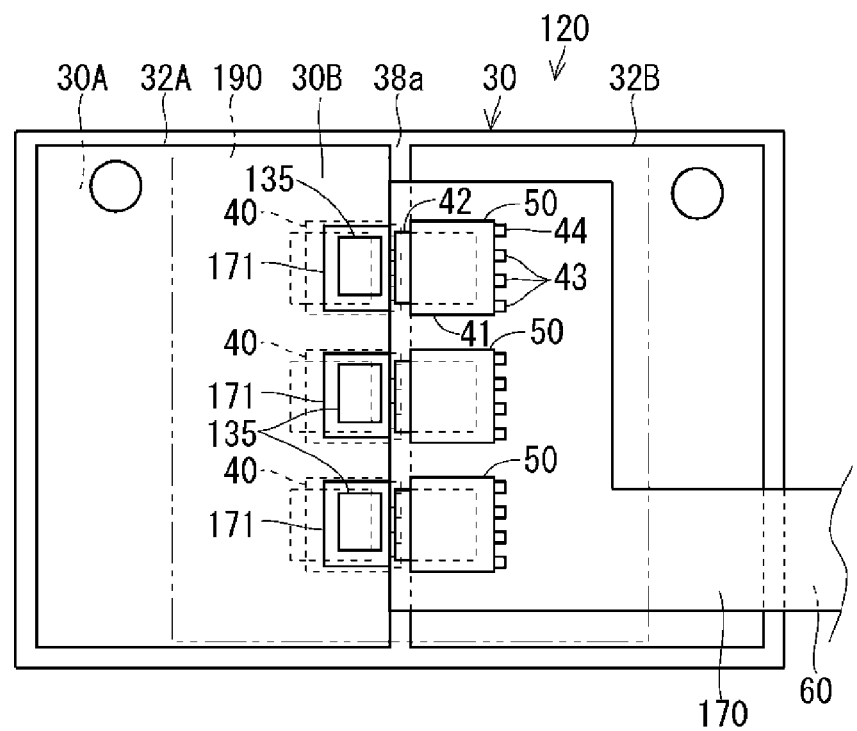
FIG. 7 is a bottom view showing the substrate structure.

A substrate structure 120 according to Embodiment 2 will be described. FIG. 6 is a plan view showing the substrate structure 120. FIG. 7 is a bottom view showing the substrate structure 120 from the opposite side to that shown in FIG. 6. It should be noted that, in the description of this embodiment, the same configuration elements to those described for the substrate structure 20 of Embodiment 1 are given the same reference numerals and redundant descriptions thereof are omitted.

Embodiment 2 describes a case where the first elements 40 and the second elements 50 are mounted dispersed on two sides of the boundary between the first conductive plate 32A and the second conductive plate 32B.

That is, in Embodiment 1, the first elements 40 are mounted on the first conductive plate 32A side. The configuration with which each first element 40 is mounted on the base substrate 30 is similar to that in Embodiment 1. Regarding Embodiment 2, the differences between the substrate structure 120 and the substrate structure 20 are the mounting position of the second elements 50 and the mounting configuration thereof.

In other words, the second elements 50 are mounted on the second conductive plate 32B side. More specifically, the element main body portion 41 of each second element 50 is located on the second conductive plate 32B side. The first elements 40 are provided on the first main surface 30A side of the base substrate 30 and the second elements 50 are provided on the second main surface 30B side on the opposite side to the first main surface 30A. For each of the first element 40 and the second element 50, the first terminal 42 is located more on the first conductive plate 32A side than the element main body portion 41 is, and the second terminals 43 and the third terminal 44 are located more on the second conductive plate 32B side than the first element 41 is.

A second sheet-shaped wiring member 170 is provided on the second main surface 30B side of the base substrate 30. Similar to the first sheet-shaped wiring member 60, the second sheet-shaped wiring member 170 is provided with a second linear conductor (corresponding to the first linear conductor) that serves as a conductor. In a state where the second sheet-shaped wiring member 170 is overlaid on the second main surface 30B of the second conductive plate 32B, the above second element 50 is mounted on the second sheet-shaped wiring member 170. At this time, the second terminals 43 are soldered to the second conductive plate 32B via a through hole in the second sheet-shaped wiring member 170. Also, the third terminal 44 is soldered to the second linear conductor of the second sheet-shaped wiring member 170. The third terminal 44 receives a control signal via the second linear conductor.

Both the first sheet-shaped wiring member 60 and the second sheet-shaped wiring member 170 may be drawn to the outside of the base substrate 30. The first linear conductor of the first sheet-shaped wiring member 60 and the second linear conductor of the second sheet-shaped wiring member 170 may be connected to each other at any region of the base substrate 30, and one of the first sheet-shaped wiring member 60 and the second sheet-shaped wiring member 170 may be drawn to the outside of the base substrate 30.

The first terminal 42 of the second element 50 extends from the second conductive plate 32B toward the insulating interposed portion 38a. At least a portion of the second sheet-shaped wiring member 170 extends as an extension portion 171 from the first terminal 42 toward the first conductive plate 32A. This extension portion 171 is provided with a relay conductor similar to that of the above relay conductor 62a. Similar to the second terminals 43 being connected to the second conductive plate 32B in Embodiment 1, the first terminal 42 is connected to the relay conductor via a solder, and the relay conductor is connected to the first conductive plate 32A via solder 135. Accordingly, the first terminal 42 is electrically connected to the first conductive plate 32A.

In Embodiment 2, the first element 40 is mounted on the first conductive plate 32A side and the second element 50 is mounted on the second conductive plate 32B side. In other words, this Embodiment 2 is an example where the first elements 40 and the second elements 50 are mounted dispersed on two sides of the boundary between the first conductive plate 32A and the second conductive plate 32B.

With this Embodiment 2, similar effects and operations can be obtained to those of Embodiment 1. Also, the first elements 40 and the second elements 50 are dispersed on two sides of the boundary, and thus heat generated by the first elements 40 and the second elements 50 is dispersed. Thus, heat can be efficiently dissipated from the substrate structure 120.

Also, even if a case is envisioned where a heat dissipating member 190 such as a heat dissipating fin is provided on only one surface of the substrate structure 120, heat can be efficiently dissipated. For example, envision a case where the heat dissipating member 190 is provided on only one surface (the first main surface 30A of the base substrate 30) of the substrate structure 120. Examples of the regions where the heat dissipating member 190 is disposed are shown with two-dot chain lines in FIGS. 6 and 7. In this case, in the portion where the first elements 40 are mounted, the heat dissipating member 190 can be disposed so as to be in direct contact with or near the first elements 40. Therefore, heat generated by the first elements 40 is efficiently dissipated by the heat dissipating member 190. Also, in the portion where the second elements 50 are mounted, the heat dissipating member 190 can be disposed so as to be in direct contact with or near the second elements 50 from the opposite side thereto relative to the base substrate 30. Heat generated by the second elements 50 is conveyed to the heat dissipating member 190 via the base substrate 30 (here, the second conductive plate 32B) and efficiently dissipated. Thus, heat generated by the first elements 40 and the second elements 50 can be efficiently dissipated via the heat dissipating member 190.

Embodiment 2 describes an example where all of the first elements 40 are mounted on the first conductive plate 32A side, and all of the second elements 50 are mounted on the second conductive plate side 32B. The example where the first elements 40 and the second elements 50 are mounted dispersed on two sides of the boundary between the first conductive plate 32A and the second conductive plate 32B is not limited to the above example.

Figure 8:
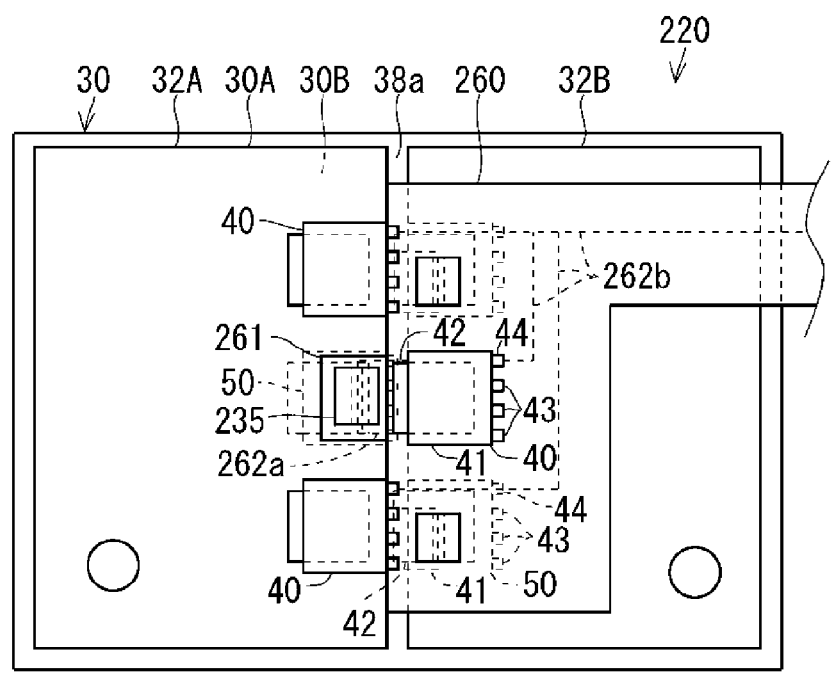
FIG. 8 is a plan view showing a substrate structure according to a variation of Embodiment 2.

FIG. 8 is a plan view showing a substrate structure 220 according to a variation of Embodiment 2. In this substrate structure 220, a plurality (here, three) of the first elements 40 are mounted alternatively on the first conductive plate 32A side and the second conductive plate 32B side. That is, the plurality of first elements 40 are disposed side by side in the extending direction of the boundary between the first conductive plate 32A and the second conductive plate 32B. The odd numbered first elements 40 are mounted on the first conductive plate 32A side facing from one side to the other side, in the extending direction of the boundary. The even numbered first element 40 is mounted on the second conductive plate 32B side at a position where it does not overlap the odd numbered first elements 40 in the extending direction of the boundary (a position between the odd numbered first elements 40 or a position on an outer side thereof).

The configuration with which the odd numbered first elements 40 are mounted to the base substrate 30 and the configuration with which they are connected to a first sheet-shaped wiring member 260 (corresponding to the first sheet-shaped wiring member 60) are the same as those in Embodiment 1. The even numbered first element 40 is mounted on the first sheet-shaped wiring member 260 on the base substrate 30 in the same orientation as the odd numbered first elements 40. The second terminals 43 of the even numbered first element 40 are soldered to the second conductive plate 32B via a through hole in the first sheet-shaped wiring member 260. The third terminal 44 of the even numbered first element 40 is soldered to a first linear conductor 262b of the first sheet-shaped wiring member 260. The first terminal 42 of the even numbered first element 40 extends from the second conductive plate 32B toward the insulating interposed portion 38a. At least a portion of the first sheet-shaped wiring member 260 extends as an extension portion 261 from the first terminal 42 toward the first conductive plate 32A. This extension portion 261 is provided with a relay conductor 262a similar to the above relay conductor 62a. Similar to how the second terminals 43 are connected to the second conductive plate 32B in Embodiment 1, the first terminal 42 is connected to the relay conductor 262a via solder, and the relay conductor 262a is connected to the first conductive plate 32A via solder 235. Accordingly, the first terminal 42 is electrically connected to the first conductive plate 32A.

Also, a plurality (here, three) of the second elements 50 are mounted alternating between the first conductive plate 32A side and the second conductive plate 32B side. The positions where the second elements 50 are mounted to the first conductive plate 32A and the second conductive plate 32B are the reverse of the mounting positions of the first elements 40 with reference to the above-described boundary. That is, the second elements 50 are disposed side by side in the extending direction of the boundary between the first conductive plate 32A and the second conductive plate 32B. The odd numbered second elements 50 are mounted on the second conductive plate 32B side facing from one side to the other side in the extending direction of the boundary. The even numbered second element 50 is mounted on the first conductive plate 32A side at a position where it does not overlap the odd numbered second elements 50 in the extending direction of the boundary (a position between the odd numbered second elements 50 or a position on an outer side thereof).

Regarding both the first elements 40 and the second elements 50, the first terminal 42 is located more on the first conductive plate 32A side than the element main body portion 41 is, and the second terminals 43 and the third terminal 44 are located more on the second conductive plate 32B side than the element main body portion 41 is. The configuration with which the odd numbered second elements 50 are connected to the first conductive plate 32A, the second conductive plate 32B, and the second sheet-shaped wiring member (corresponding to the second sheet-shaped wiring member 70) is the same as the configuration with which the even numbered first element 40 is connected to the first conductive plate 32A, the second conductive plate 32B, and the first sheet-shaped wiring member 260. The configuration with which the even numbered second element 50 is connected to the first conductive plate 32A, the second conductive plate 32B, and the second sheet-shaped wiring member (existing on the rear side of the first sheet-shaped wiring member) is the same as the configuration with which the odd numbered first elements 40 are connected to the first conductive plate 32A, the second conductive plate 32B, and the first-sheet shaped wiring member 260.

The first sheet-shaped wiring member 260 and the second sheet-shaped wiring member may both be drawn outside of the base substrate 30. The first linear conductor of the first sheet-shaped wiring member and the second linear conductor of the second sheet-shaped wiring member may be connected to any portion of the base substrate 30, and the one of the first sheet-shaped wiring member and the second sheet-shaped wiring member may be drawn outside of the base substrate 30.

With this variation as well, similar operations and effects to those of Embodiment 2 can be obtained.

Embodiment 2 and its variation can also be comprehended in the following manner. That is, on the premise that a plurality of the first element 40 and the second element 50 are provided, a first element 40 and a second element 50 that at least partially overlap in the extending direction of the boundary between the first conductive plate 32A and the second conductive plate 32B are dispersed on two sides of the boundary.

Variation

If the first conductive plate and the second conductive plate have an L shape or the like and are adjacent to other via boundaries between two or more straight lines, the first elements and the second elements may be mounted in the above-described relation at any boundary.

Note that the configurations of the above embodiments and variations can be combined as appropriate provided that no mutual contradiction arises.

The invention claimed is:

1. A substrate structure comprising:
a base substrate including a first conductive plate and a second conductive plate;
a first element connected to the first conductive plate and the second conductive plate; and
a second element connected to the first conductive plate and the second conductive plate,
wherein the first conductive plate and the second conductive plate are disposed on the base substrate on the same plane in a state of being electrically insulated from each other,
the first element is mounted on a first main surface of the base substrate, and
the second element is mounted on a second main surface that is on the opposite side to the first main surface relative to the base substrate;
wherein the base substrate includes an insulating portion that is molded in a mold with the first conductive plate and the second conductive plate acting as inserts, a thickness of the insulating portion being equal to a thickness of the first and second conductive plates, and
the insulating portion insulates the first conductive plate and the second conductive plate from each other, and holds the first conductive plate and the second conductive plate in a state of extending along the same plane.

2. The substrate structure according to claim 1, wherein the first element and the second element are mounted so as to at least partially overlap each other in a direction extending along a boundary between the first conductive plate and the second conductive plate.

3. The substrate structure according to claim 2, wherein the first element and the second element are mounted dispersed on two sides of a boundary between the first conductive plate and the second conductive plate.

4. The substrate structure according to claim 2, further comprising:
a first sheet-shaped wiring member overlaid on the first main surface of the base substrate; and
a second-sheet shaped wiring member overlaid on the second main surface of the base substrate,
wherein the first element is a first switching element that includes a first control terminal that receives a control signal, and allows and interrupts the passage of a current between the first conductive plate and the second conductive plate in response to the control signal received by the first control terminal,
the second element is a second switching element that includes a second control terminal that receives a control signal, and allows and interrupts the passage of a current between the first conductive plate and the second conductive plate in response to the control signal received by the second control terminal,
the first sheet-shaped wiring member includes a first linear conductor connected to the first control terminal, and
the second sheet-shaped wiring member includes a second linear conductor connected to the second control terminal.

5. The substrate structure according to claim 1, wherein the first element and the second element are mounted dispersed on two sides of a boundary between the first conductive plate and the second conductive plate.

6. The substrate structure according to claim 5, further comprising:
a first sheet-shaped wiring member overlaid on the first main surface of the base substrate; and
a second-sheet shaped wiring member overlaid on the second main surface of the base substrate,
wherein the first element is a first switching element that includes a first control terminal that receives a control signal, and allows and interrupts the passage of a current between the first conductive plate and the second conductive plate in response to the control signal received by the first control terminal,
the second element is a second switching element that includes a second control terminal that receives a control signal, and allows and interrupts the passage of a current between the first conductive plate and the second conductive plate in response to the control signal received by the second control terminal,
the first sheet-shaped wiring member includes a first linear conductor connected to the first control terminal, and
the second sheet-shaped wiring member includes a second linear conductor connected to the second control terminal.

7. The substrate structure according to claim 1, further comprising:
a first sheet-shaped wiring member overlaid on the first main surface of the base substrate; and
a second-sheet shaped wiring member overlaid on the second main surface of the base substrate,
wherein the first element is a first switching element that includes a first control terminal that receives a control signal, and allows and interrupts the passage of a current between the first conductive plate and the second conductive plate in response to the control signal received by the first control terminal,
the second element is a second switching element that includes a second control terminal that receives a control signal, and allows and interrupts the passage of a current between the first conductive plate and the second conductive plate in response to the control signal received by the second control terminal, the first sheet-shaped wiring member includes a first linear conductor connected to the first control terminal, and the second sheet-shaped wiring member includes a second linear conductor connected to the second control terminal.

8. The substrate structure according to claim 7, wherein the first linear conductor and the second linear conductor are electrically connected to each other at a portion of the base substrate excluding the first conductive plate and the second conductive plate, via a conductive portion.

* * * * *